United States Patent
Ku

(10) Patent No.: US 7,405,603 B2
(45) Date of Patent: Jul. 29, 2008

(54) DELAYED LOCKED LOOP CIRCUIT

(75) Inventor: Young Jun Ku, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 78 days.

(21) Appl. No.: 11/544,283

(22) Filed: Oct. 6, 2006

(65) Prior Publication Data

US 2007/0085581 A1    Apr. 19, 2007

(30) Foreign Application Priority Data

Oct. 6, 2005    (KR) .................. 10-2005-0093756

(51) Int. Cl.
*H03L 7/06* (2006.01)
(52) U.S. Cl. .................. 327/158; 327/156
(58) Field of Classification Search .................. 327/156, 327/158
See application file for complete search history.

(56) References Cited

U.S. PATENT DOCUMENTS 6,914,798 B2 *  7/2005  Kwon et al. ............ 365/145
2007/0008024 A1 *  1/2007  Cheng .................... 327/291
2007/0070731 A1 *  3/2007  Choi ..................... 365/194

* cited by examiner

*Primary Examiner*—Tuan T. Lam
*Assistant Examiner*—Diana J Cheng
(74) *Attorney, Agent, or Firm*—Ladas & Parry LLP

(57) ABSTRACT

A Delayed Locked Loop Circuit of DLL comprises a buffer that receives a power-down signal and an inverted signal of a first clock signal; first and second delay lines an output device that outputs signals corresponding to the output signals of the first and second delay lines respectively; a replica delay unit, a phase comparator for comparing a phase difference between the output signal of the second buffer and the output signal of the replica delay unit; and a delay line controller for controlling delay times of the first delay line and the second delay line by corresponding to a comparison result of the phase comparator. The DLL circuit is configured such that the first and second buffers are disabled when the power-down mode entry notifying signal corresponding to a power-down mode is provided.

7 Claims, 3 Drawing Sheets

DELAYED LOCKED LOOP CIRCUIT

TECHNICAL FIELD

The present invention relates to a DLL circuit (Delayed Locked Loop Circuit) which is used for a synchronous memory device, and more particularly, to a DLL circuit for reducing power consumption.

BACKGROUND ART

In general, a synchronous memory device such as DDR SDRAM uses a DLL circuit, which is an internal clock generation circuit used for synchronizing an external clock from an outside source to output data.

Specifically, when a clock input from outside of a memory device is used as an internal clock for the memory device, the clock's propagation through internal circuitry will cause a time delay. A DLL circuit controls or compensates for propagation delay such that internal and external clocks can have the same phase. More accurately, a DLL circuit is used for outputting data by synchronizing output data to an external clock.

FIG. 1 is an example of a typical prior art DLL circuit. Clock buffers 111 and 112 are internal buffers for receiving external clocks /CLK and CLK. Here, the clock signal /CLK is an inverted signal of the clock signal CLK. The clock signals /CLK and CLK passed through each of the clock buffers 111 and 112 are indicated by internal clock signals fclkt2 and rclkt2.

A delay line 113 receives the internal clock signal fclkt2 and delays the internal clock signal for a predetermined period of time. Delay line 114 receives the internal clock signal rclkt2 and delays the internal clock signal rclkts for a predetermined period of time. For reference, delay times of the delay lines 113 and 114 are varied by a delay line controller 117 as will be described later.

A replica delay unit 115 for receiving an output signal of the delay line 114, is a delay unit having a fixed delay time, which nearly coincides with the sum of a delay time t1 of the clock buffer 111 and a delay time t2 of a DLL driver 118.

A phase comparator 116 compares a phase of the internal clock signal rclkt2, which is an output signal of the buffer 112, with a phase of an output signal fb_clk of the replica delay unit 115.

The delay line controller 117 controls the delay times of the delay lines 113 and 114 in response to an output signal of the phase comparator 116.

DLL drivers 118 and 119 receive the output signals of the delay lines 113 and 114 to output internal DLL signals fclk_dll and rclk_dll.

When the phases of signals rclkt2 and fb_clk applied to the phase comparator 116 coincide, the locking of the DLL circuit is made. That is, the delay time of the delay lines 113 and 114 controlled by the delay line controller 117 will be fixed.

Such a DLL circuit will be placed into an enable state when a memory device is in normal operation mode, but an operation of the DLL circuit needs to be blocked while the memory device maintains power-down mode to reduce the power consumption.

Conventionally, a method of blocking an operation of the buffer 111 at power-down mode has been used. That is, when the memory device enters into power-down mode, the buffer 111 is disabled by using an inverted signal Ckeb of a clock enable signal Cke to reduce the power consumed in the DLL circuit.

Of course, it is preferable that the buffer 111 and the buffer 112 are both disabled to greatly reduce the power consumed in the DLL circuit at power-down mode.

However, when the buffer 112 is disabled at power down mode and the buffer 112 is enabled upon exiting from power-down mode, a problem usually follows.

When the buffer 112 is enabled upon exiting from power-down mode, the internal clock signal rclkt2 is immediately applied to the phase comparator 116, but the output signal fb_clk of the replica delay unit, which is a feedback signal, is applied after a predetermined time period (after the total delay time of the delay line 114 and the replica delay unit 115 has passed). Due to this, the phase comparator 116 will make a wrong decision, and the DLL locking time will be also lengthened.

For this reason, conventionally, the buffer 112 should be maintained in an enable state even at power-down mode. As a result there has been a problem that the power comsumed in the DLL circuit even at power-down mode is above a specified level.

SUMMARY OF THE INVENTION

In order to solve the aforementioned problem, the present invention provides a DLL circuit in which the power consumption at power-down mode can be reduced.

Moreover, the present invention provides a DLL circuit, which can perform a stable DLL operation even upon exiting from power-down mode.

A DLL circuit of a synchronous memory device according to the present invention includes a first buffer that receives a first clock signal applied from the outside, and a second buffer that receives an inverted signal of the first clock signal. The first and second buffers are enabled when the synchronous memory device is in normal operation mode. The first and second buffers are disabled when the synchronous memory device is in power-down mode.

The present invention may further include a first delay line that receives an output signal of the first buffer, a second delay line that receives an output signal of the second buffer, a replica delay unit that delays the second delay line for a predetermined period of time, a phase comparator that compares a phase difference between the output signal of the second buffer and the output signal of the replica delay unit, a delay line controller that controls delay times of the first delay line and the second delay line by receiving an output signal of the phase comparator, a first driver that receives an output signal of the first delay line to output a first internal clock, and a second driver that receives an output signal of the second delay line to-output a second internal clock.

The present invention may further include a controller that controls the timing of enabling the phase comparator when the synchronous memory device exits from power-down mode. Here, the synchronous memory device is set such that a time consumed from exiting from power-down mode to enabling of the phase comparator is preferably equal to a time for which the output signal of the second buffer passes through the second delay line and the repica delay unit until it applies to the phase comparator.

DETAILED DESCRIPTION

Hereinafter, a preferred embodiment of the present invention will be described in detail with reference to the accompanying drawings.

Figure 1:
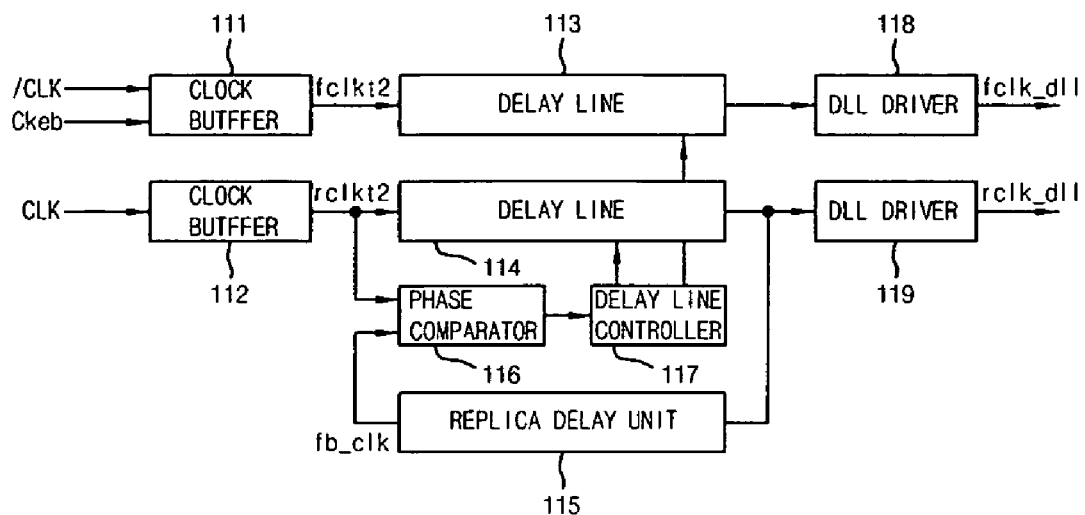
FIG. 1 is an example of a prior art DLL circuit.
Figure 2:
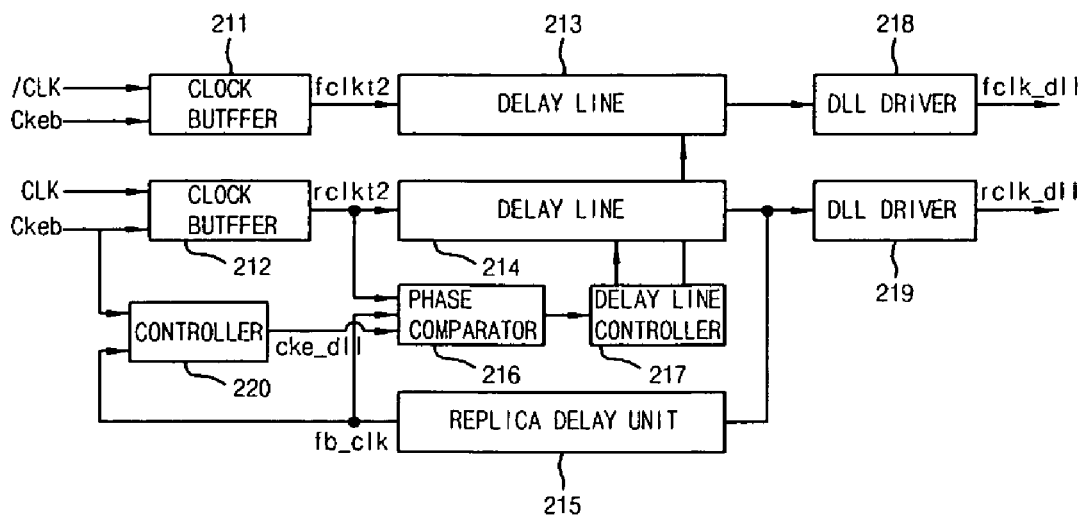
FIG. 2 is one embodiment of a DLL circuit according to the present invention.

FIG. 2 is an embodiment of a DLL circuit according to the present invention. The clock buffers 211 and 212 are internal buffers that receive external clocks /CLK and CLK. The clock signal /CLK (pronounced as "clock bar" or as "clock complement") is an inverted form of the clock signal, CLK. The clock signals /CLK and CLK, which have passed through the clock buffers 211 and 212 respectively, are indicated by internal clock signals fclkt2 and rclkt2. Unlike FIG. 1, it should be noted that the clock buffers 211 and 212 in FIG. 2 are controlled by an inverted signal Ckeb of a clock enable signal Cke. The signal Ckeb is a low level or logic zero when a memory device is in normal operation mode. The signal Ckeb is a high level or logic 1, when the memory device is in a power-down mode. For reference, the clock buffers 211 and 212 are disabled when the device enters into power-down mode.

A delay circuit or delay line 213 receives the internal clock signal fclkt2 at an input end of the delay line 213 in order to delay the internal clock signal fclkt2 for a predetermined period of time. The delay circuit/delay line 214 receives the internal clock signal rclkt2 at an input end of the delay line 214 and delays the internal clock signal rclkt2 for a predetermined period of time. For reference, the delay times in the delay lines 113 and 114 are varied by a delay line controller 217 as will be described later.

A replica delay unit 215 receives an output signal from the delay line 214 and provides a fixed delay time that nearly coincides with the sum of a delay time t1 of the clock buffer 211 and a delay time t2 of a DLL driver 218.

A phase comparator 216 compares the phase of the internal clock signal rclkt2, which is an output signal of the buffer 212, with a phase of an output signal fb_clk of the replica delay unit 215.

The delay line controller 217 controls the delay time of the delay lines 213 and 214 in response to the output signal of the phase comparator 216.

DLL drivers 218 and 219 receive the output signals of the delay lines 213 and 214. The DLL drivers also output the internal DLL signals fclk_dll and rclk_dll.

The controller 220 receives a signal Ckeb and a signal fb_clk and outputs a signal cke_dll to the phase comparator 216 to control operation of the phase comparator 216. When a signal Ckeb for entering the power-down mode is applied at a high level, the controller 220 outputs the signal cke_dll to the phase comparator at a low level to block operation of the phase comparator 216 (refer to FIG. 3). That is, unlike conventional cases, the phase comparator 216 according to the present invention is disabled by the controller 220 upon entering into the power-down mode. An example of the controller 220 depicted in FIG. 2 is illustrated in FIG. 3.

Figure 3:
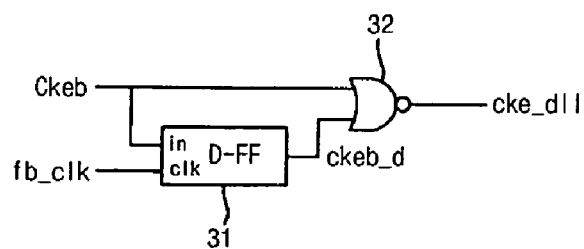
FIG. 3 is an embodiment of a controller illustrated in FIG. 2.

FIG. 3 is an example of a controller suggested in this invention. As illustrated in the drawing, a controller is comprised of a D flip-flop 31 and a NOR gate 32. The input terminal (in) of D flip-flop 31 receives the signal Ckeb, and the clock terminal (clk) receives the signal fb_clk. The NOR gate 32 receives the signal Ckeb and an output signal cked_d of the D flip-flop 31, and an output signal cke_dll of the NOR gate 32 controls operation of the phase comparator 216 shown in FIG. 2. For reference, the phase comparator 216 is disabled when the output signal cke_dll of the NOR gate 32 is a low level.

Hereinafter, an operation of the embodiment suggested in FIG. 2 will be divided for explanation into normal operation mode and power-down mode.

First, the operation of a DLL circuit in normal operation mode will be described.

In normal operation mode, the signal Ckeb is low level and therefore the clock buffers 211 and 212 are in enable state and the controller 220 is in disable state. Since the controller 220 is in disable state, the operation of a circuit of FIG. 2 is same as the operation of a typical DLL circuit.

In other words, internal clock signals fclkt2 and rclkt2 output from the clock buffers 211 and 212 pass through the delay lines 213 and 214 respectively to be applied to DLL drivers 218 and 219. An output signal of the delay line 214 is also applied to the replica delay unit 215. The phase comparator 216 compares a phase difference between an output signal fb_clk of the replica delay unit 215 and an output signal rclkt2 of the clock buffer 212. The delay line controller 217 controls the delay times of the delay lines 213 and 214 in response to an output signal of the phase comparator 216. The above-mentioned operation will be repeated until the phases of the signals rclkt2 and fb_clk applied to the phase comparator 216 coincide with each other within error range.

Next, the operation of a DLL circuit in power-down mode will be described.

Upon entering the power-down mode, an inverted signal Ckeb of the clock enable signal is changed to a high level. In this case, the clock buffers 211 and 212 are disabled by the signal Ckeb. When both clock buffers 211 and 212 are in a disable state, the power consumed in a DLL circuit of FIG. 2 can be reduced.

Upon entering into the power-down mode, since the signal Ckeb is at a high level, an output signal cke_dll of the controller 220 is at a low level (refer to FIG. 3.) When the signal cke_dll is low level, the phase comparator 216 will be in the disabled state. Unlike conventional cases, therefore, the power consumption of the phase comparator 216 can be also reduced.

Next, upon exiting from power-down mode, an inverted signal Ckeb of the clock enable signal is changed to a low level. Therefore, the clock buffers 211 and 212 will be changed from disable state to enable state.

Concerning this, the phase comparator 216 of this invention will operate after a predetermined period of time passes since the signal Ckeb of low level is applied (in this regard, the operation is greatly different from the prior art). Concerning this it will be more specifically described in detail. In conventional cases, upon exiting from power-down mode, the phase comparator operates immediately, thereby causing a malfunction. This malfunction is generated because an abnormal signal fb_clk is applied.

In the invention disclosed and claimed herein, however, phase comparator operation 216 is controlled by the controller 220. Concerning this, as illustrated in FIG. 3, an embodiment of the controller will be described.

As described above, since an output signal cke_dll of the controller 32 maintains low level just prior to exiting from power-down mode, the phase comparator 216 is in disable state. Upon exiting from the power-down mode, the signal Ckeb is changed to a low level. An output signal ckeb_d of the D flip-flop 31 will be changed to low level after a signal fb_clk is applied to a clock terminal. Therefore, after an output signal rclkt2 of the clock buffer 212, which is enabled upon exiting from power-down mode, passes through the delay line 214 and the replica delay unit 215 to be applied to a clock terminal of the D flip-flop 31, the output signal ckeb_d of D flip-flop 31 becomes low level. As a result, an output signal cke_dll of the controller becomes high level after the signal rclkt2 passes through the delay line 214 and the replica delay unit 215 to be applied to a clock terminal of D flip-flop 31. As described above, when the output signal cke_dll of the controller becomes high level, the phase comparator is enabled to operate. Therefore, a malfunction caused by operating the phase comparator upon exiting from power-down mode can be prevented.

Figure 4:
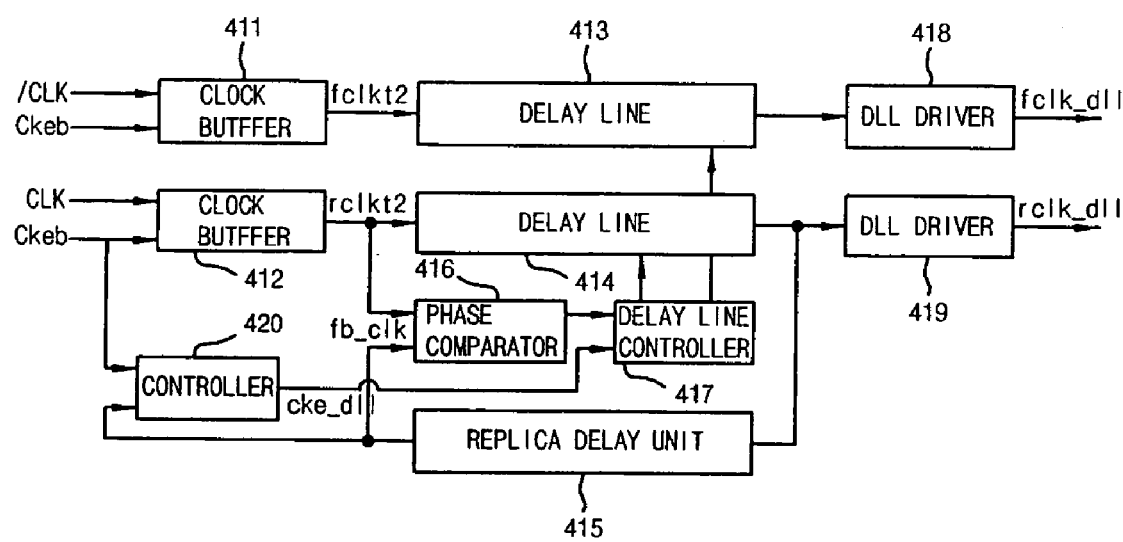
FIG. 4 is another embodiment of a DLL circuit according to the present invention.

FIG. 4 is another embodiment of a DLL circuit according to the present invention. As can be seen in FIG. 4, there is provided a controller 420 for controlling a delay line controller 417.

Clock buffers 411 and 412 are internal buffers for receiving external clocks /CLK and CLK. The clock buffers 411 and 412 also receive the signals Ckeb. The clock signal /CLK is an inverted signal of the clock signal CLK. The clock signals /CLK and CLK which have passed through the clock buffers 411 and 412 respectively are indicated by internal clock signals fclkt2 and rclkt2. As illustrated in FIG. 2, it should be noted that the clock buffers 411 and 412 in FIG. 4 are controlled by an inverted signal Ckeb of a clock enable signal Cke. The signal Ckeb is low level when a memory device is in normal operation mode, and the signal Ckeb is high level when it is in power-down mode. For reference, the clock buffers 411 and 412 become disable state upon entering into power-down mode.

A first delay line 413 receives the internal clock signal fclkt2 at the input end of the delay line 413 in order to delay the signal fclkt2 for a predetermined period of time. A second delay line 414 receives the internal clock signal rclkt2 at the input end of the delay line 414 to delay the rclkt2 signal for a predetermined period of time. For reference, the delay times in the delay lines 413 and 414 are varied by a delay line controller 417 as will be described later.

A replica delay unit 415 receives an output signal of the delay line 414. The replica delay unit 415 is a delay unit having a fixed delay time, which nearly coincides with the sum of a delay time t1 of the clock buffer 411 and a delay time t2 of a DLL driver 418.

A phase comparator 416 compares a phase of the internal clock signal rclkt2, which is an output signal of the buffer 412, with a phase of an output signal fb_clk of the replica delay unit 415.

The delay line controller 417 controls the delay time of the delay lines 413 and 414 in response to the output signal of the phase comparator 416.

DLL drivers 418 and 419 receive the output signals of the delay lines 413 and 414 to output internal DLL signals fclk_dll and rclk_dll.

The controller 420 receives a signal Ckeb and a signal fb_clk and outputs a signal cke_dll for controlling an operation of the delay line controller 417. When a signal Ckeb for noftifying power-down mode entry is applied at high level, the controller 220 outputs the signal cke_dll at low level to block an operation of the delay line controller 417.

In the embodiment illustrated in FIG. 4, a wrong phase detection result is output from the phase comparator 416 upon exiting from a power-down mode as in the prior to be applied to the delay line controller. However, for the delay line controller 417 according to the present invention, the delay line controller 417 is enabled after the signal fb_clk is normally applied. Therefore, the possibility of generating a malfunction as in the prior art is reduced or eliminated.

Figure 5:
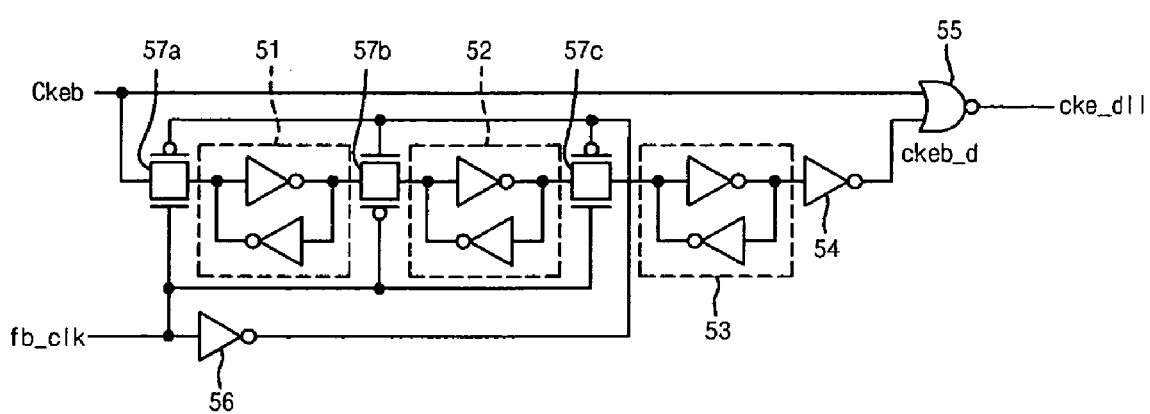
FIG. 5 is an example of a controller as illustrated in FIG. 4.

FIG. 5 is an embodiment of a controller illustrated in FIG. 4. The controller of FIG. 5 includes latches 51, 52 and 53, inverters 54 and 56, a NOR gate 55, and transmission switches 57a, 57b and 57c.

When a signal fb_clk, which is a delay signal of an internal clock signal rclkt2, is changed to high level for the first time after exiting from power-down mode, a clock signal Ckeb will be stored in latch 51. When a signal fb_clk is changed to low level after a half cycle of the internal clock signal rclkt2, the signal CKeb stored in latch 51 will be stored in or shifted to latch 52. Next, when the signal fb_clk is changed again to high level after a half cycle of the internal clock signal rclkt2, the signal Ckeb stored in the latch 52 passes into latch 53 and an inverter 54 to be applied to a NOR gate 55. An output signal of the inverter 54 is "ckeb_d."

The NOR gate 55 receives the signal Ckeb and the output signal ckeb_d of the inverter 54, and the delay line controller 417 will be enabled when an output signal cke_dll of the NOR gate 55 is high level. As a result, it is seen that the delay line controller is enabled after one cycle of a clock signal CLK or /CLK.

As seen in FIGS. 4 and 5, a malfunction of the DLL circuit can be prevented by delaying a timing of operating a delay line controller upon exiting from power-down mode.

According to the present invention, in power-down mode, the power consumed in a DLL circuit can be reduced, and furthermore a malfunction of the DLL circuit which may be generated upon exiting from power-down mode can be prevented in advance.

The embodiments described above and depicted in the figures are merely examples of the invention. The true scope of which is defined and determined by the appurtenant claims.

The invention claimed is:

1. A DLL circuit comprising:
   a first buffer that receives a power-down mode signal and a first external clock signal;
   a second buffer that receives the power-down mode signal and an inverted signal of the first clock signal;
   a first delay line that receives an output signal of the first buffer and which delays the output signal of the first buffer for a predetermined period of time;
   a second delay line that receives an output signal of the second buffer and which delays the output signal of the second buffer for a predetermined period of time;
   an output device that outputs signals corresponding to the output signals of the first and second delay lines respectively;
   a replica delay unit that delays an output of the second delay line;
   a phase comparator that compares phase differences between the output signal of the second buffer and an output signal of the replica delay unit;
   a delay line controller that controls delay times of the first delay line and the second delay line by corresponding to a comparison result of the phase comparator;
   a controller that controls an enable/disable state of the phase comparator based on a state of the power-down mode signal,
   wherein the first and second buffers are disabled when the power-down mode entry notifying signal corresponding to a power-down mode is provided.

2. The DLL circuit according to claim 1, wherein the controller controls a timing of enabling the phase comparator corresponding to exiting from power-down mode.

3. The DLL circuit according to claim 2, wherein the controller controls a time consumed from exiting from power-down mode to the enabling of the phase comparator to a time for which the output signal of the second buffer passes through the second delay line and the replica delay unit until it applies to the phase comparator.

4. A DLL circuit comprising:
a first buffer that receives a power-down mode signal and a first external clock signal;
a second buffer that receives the power-down mode signal and an inverted signal of the first clock signal;
a first delay line that receives an output signal of the first buffer and which delays the output signal of the first buffer for a predetermined period of time;
a second delay line that receives an output signal of the second buffer and which delays the output signal of the second buffer for a predetermined period of time;
an output device that outputs signals corresponding to the output signals of the first and second delay lines respectively;
a replica delay unit that delays an output of the second delay line;
a phase comparator that compares phase differences between the output signal of the second buffer and an output signal of the replica delay unit;
a delay line controller that controls delay times of the first delay line and the second delay line by corresponding to a comparison result of the phase comparator,
a controller that controls an enable/disable state of the delay line controller based on a state of the power-down mode signal,
wherein the first and second buffers are disabled when the power-down mode entry notifying signal corresponding to a power-down mode is provided.

5. The DLL circuit according to claim 4, wherein the controller controls enabling the delay line controller by corresponding to exiting from power-down mode.

6. The DLL circuit according to claim 5, wherein the controller controls a timing of enabling the delay line controller in response of the output signal of the replica delay unit.

7. The DLL circuit according to claim 6, wherein the delay line controller is enabled by the controller after one cycle of the first clock signal has passed since exiting from power-down mode.

* * * * *